United States Patent [19]

Bauer et al.

[11] Patent Number: 5,710,445
[45] Date of Patent: Jan. 20, 1998

[54] GATE TURN-OFF THYRISTOR FOR HIGH BLOCKING VOLTAGE AND SMALL COMPONENT THICKNESS

[75] Inventors: Friedhelm Bauer, Suhr; Simon Eicher, Zürich, both of Switzerland

[73] Assignee: Asea Brown Boveri AG, Baden, Switzerland

[21] Appl. No.: 495,080

[22] Filed: Jun. 27, 1995

[30] Foreign Application Priority Data

Sep. 2, 1994 [DE] Germany ............... P 44 31 294.6

[51] Int. Cl.⁶ .................... H01L 29/74; H01L 31/111
[52] U.S. Cl. ................... 257/147; 257/149; 257/152; 257/153; 257/163; 257/172
[58] Field of Search .................... 257/149, 152, 257/153, 163, 172, 147

[56] References Cited

U.S. PATENT DOCUMENTS

| | | | |
|---|---|---|---|
| 4,484,214 | 11/1984 | Misawa et al. | 257/149 |
| 4,742,382 | 5/1988 | Jaecklin | 257/149 |
| 5,001,535 | 3/1991 | Nishizawa et al. | 257/138 |
| 5,017,992 | 5/1991 | Roggwiller | 257/149 |
| 5,028,974 | 7/1991 | Kitagawa et al. | 257/149 |
| 5,491,351 | 2/1996 | Bauer et al. | 257/152 |

FOREIGN PATENT DOCUMENTS

| | | |
|---|---|---|
| 0159797 B1 | 10/1985 | European Pat. Off. |
| 0327901 A1 | 8/1989 | European Pat. Off. |
| 0366916 A2 | 9/1990 | European Pat. Off. |
| 0556739 A1 | 8/1993 | European Pat. Off. |
| 0391337 A2 | 5/1995 | European Pat. Off. |
| 3941932 A1 | 6/1991 | Germany |

OTHER PUBLICATIONS

Japanese Patent Abstract of JP 1-165169 A., E-826, Sep. 29, 1989, vol. 13, No. 437 (Cited in Search Report).
Japanese Patent Abstract of JP 1-171272 A; E-829, Oct. 6, 1989, vol. 13, No. 445 (Cited in Search Report).
Mitsuru et al; 8000-V 1000-A Gate Turn-Off Thyristor with Low On State Voltage and Low Switching Loss; IEEE Transactions on Power Electronics, vol. 5, No. 4, Oct. 1990, pp. 430-435 (Cited in Search Report).
Tsuneo et al.; 6000-V Gate Turn-Off Thyristors (GTO's) with n-Buffer and New Anode Short Structure; IEEE Transactions on Electron Devices, vol. 38, No. 6, Jun. 1991, pp. 1491-1496 (Cited in Search Report).
IEEE Transactions on Electron Devices, vol. ED-26, No. 6, Jun. 1979, Shibib et al., pp. 959-965, "Heavily Doped Transparent-Emitter Regions in Junction Solar Cells, Diodes, and Transistors" (Discussed in Specification).

*Primary Examiner*—Tom Thomas
*Assistant Examiner*—Fetsum Abraham
*Attorney, Agent, or Firm*—Oblon, Spivak, McClelland, Maier & Neustadt, P.C.

[57] ABSTRACT

A GTO is specified which, starting from the anode-side main surface (2), comprises an anode emitter (6), a barrier layer (11), an n-base (7), a p-base (8) and a cathode emitter (9). The anode emitter (6) is designed as a transparent emitter and has anode short-circuits (10). By virtue of the combination of the barrier layer, the transparent anode emitter and the anode short-circuits, a GTO is obtained which can be operated at high switching frequencies, the substrate thickness of which can be reduced and which nevertheless exhibits no increase in the switching losses.

13 Claims, 2 Drawing Sheets

GATE TURN-OFF THYRISTOR FOR HIGH BLOCKING VOLTAGE AND SMALL COMPONENT THICKNESS

BACKGROUND OF THE INVENTION

1. Field of the Invention

The invention relates to the field of power semiconductors. It is based on a gate turn-off thyristor (GTO) according to the preamble of the first claim.

2. Discussion of Background

Such a GTO is known from numerous publications. These relate to a classical GTO as is described, for example, in European Patent EP-B1-0,159,797. Such a gate turn-off thyristor comprises, between an anode-side main surface and a cathode-side main surface, starting from the anode, a $p^+$-doped anode emitter, an n-base, a p-base and $n^+$-doped cathode regions. The cathode regions are connected to the cathode and the p-base is connected to a gate electrode, by means of which the component can be turned on and off.

In order to improve the electrical properties of GTOs, anode short-circuits may be provided in the anode emitter. This measure is, for example, described in European Patent Application EP-A1-0,327,901.

Such GTOs are today a central constituent of modern convertor drives in the high-power field. An extensive prior art of the components as well as circuitry and driving thereof has been produced. In this case the various suppliers all assume the same fundamental concept of a GTO: At maximum allowed blocking voltage, the depletion zone extends approximately 100 µm to 200 µm in front of the anode in the quasi-neutral, non-depleted region of the n-base. This structure is generally referred to by the term of the art "non-punchthrough" concept (NPT concept, NPT GTO). In practice, substrates with a thickness of approximately 800 µm are therefore required for components with 4.5 kV blocking voltage. This thickness allows a maximum switching frequency of 300 Hz to 500 Hz with only small differences with various suppliers. The absolute magnitude of this frequency is given by the switching losses which occur and the physical limits of thermal discharge by cooling.

For various reasons there is, however, a trend for users toward higher switching frequencies. One reason resides in the demand for reduction of harmonics in voltage supply networks. The NPT concept has, however, already been exploited almost to the full, so that significant improvements regarding the obtainable switching frequencies can scarcely be expected any longer.

If, however, an anode-side barrier layer is introduced, then it is possible to use a substrate with low primary doping level. In the case of such a structure, charge is forced out of the component when turning off the field. In contrast to the non-punch through concept (NPT), this is therefore referred to as a punch through concept (PT). This is described for a SiTh (Static Induction Thyristor) in U.S. Pat. No. 5,001,535. However, if the otherwise advantageous anode short-circuits are also introduced in the case of such a PT concept, then they become extremely efficient because of the increased doping level of the barrier layer. Low conductivity and reliable triggering are then possible only if the proportion of short-circuited anode area is in the region of 1% to 3%. Experiments have shown that, however, the turn-off losses then increase to a level which is no longer acceptable. This thus also rules out increasing the switching frequency. This is also the reason why the punch through concept has not been developed by any supplier for series production of GTOs.

SUMMARY OF THE INVENTION

Accordingly, one object of the invention is to provide a novel GTO, in which the switching frequency can be increased, without raising the switching losses, and the substrate thickness of which can be reduced.

This object is achieved in the case of a GTO of the type mentioned at the outset, by virtue of the features of the first claim.

The essence of the invention is thus that a combination of a transparent anode emitter, through which anode short-circuit regions penetrate, with a barrier layer is provided.

A transparent emitter is already used for low-power components such as solar cells, diodes or transistors (see, for example, IEEE Transactions on Electron Devices, Vol. ED-26, No. 6, Jun. 1979, pages 959–965). In brief, a transparent anode emitter is intended to mean an anode-side emitter with comparatively weak injection. In return, however, high proportions of the cathode-side electron current can be extracted without recombination, that is to say without filling an injected hole.

Contrary to the generally accepted opinion, according to which a PT GTO with transparent emitter is supposed to have poor triggering sensitivity because of the transparency, it has been possible to prove, in the context of the present invention, using intensive simulations and experiments, that the combination of anode short-circuits in the transparent emitter with the barrier layer leads to surprisingly good results. Contrary to the original assumption, it emerged that even a transparent emitter offers an injection efficiency which is approximately as high as a conventional emitter, in the low current density range when triggering.

The reason for this resides in the triggering condition of a GTO: It is known from thyristor theory that the triggering condition of a regenerative component is essentially given by the sum of the current gains of the partial transistor subunits. Because of the dependence of the current gains on the anode current density, these are not constant. For a conventional, commercially obtainable NPT GTO the sum of the current gains exhibits an approximately constant evolution as a function of the anode current density, with a pronounced triggering threshold, above which the sum increases steeply. This triggering threshold occurs, for example, at approximately 0.07 A/cm². In contrast, a GTO with transparent anode emitter exhibits another behavior: The sum of the current gains increases approximately linearly with increasing anode current density. There is no discernible triggering threshold. Problems therefore result when turning on, since only a pronounced triggering threshold guarantees homogeneous turn-on over the entire cross section.

A pronounced triggering threshold is formed again only by introducing emitter short-circuits. It has been possible to prove this by extensive simulations and experiments.

The desired behavior is therefore obtained only by the combination according to the invention of a transparent emitter, through which anode short-circuits penetrate, with a barrier layer.

In contrast to anode short-circuits according to the prior art, by means of which the efficiency of the emitter is set, the anode short-circuits according to the invention serve to define a pronounced triggering threshold, the efficiency of the emitter being, on the other hand, controlled by its transparency.

A preferred exemplary embodiment is distinguished in that the barrier layer has a depth of approximately 20 µm to 40 μm and an edge doping concentration of approximately $7*10^{14}$ cm$^{-3}$. Furthermore, the barrier layer can be produced either by diffusion or by epitaxy.

An epitaxially grown barrier layer with a two-stage doping profile is particularly advantageous. A region with lower doping concentration is provided directly adjoining the anode emitter. This guarantees that the anode short-circuit is subjected to a very low transverse conductance in the barrier layer.

The anode short-circuits are preferably designed with a relatively small cross section of approximately 5 to 10 μm. An optimum triggering current of approximately 300 mA is thereby obtained.

Further exemplary embodiments emerge from the corresponding dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
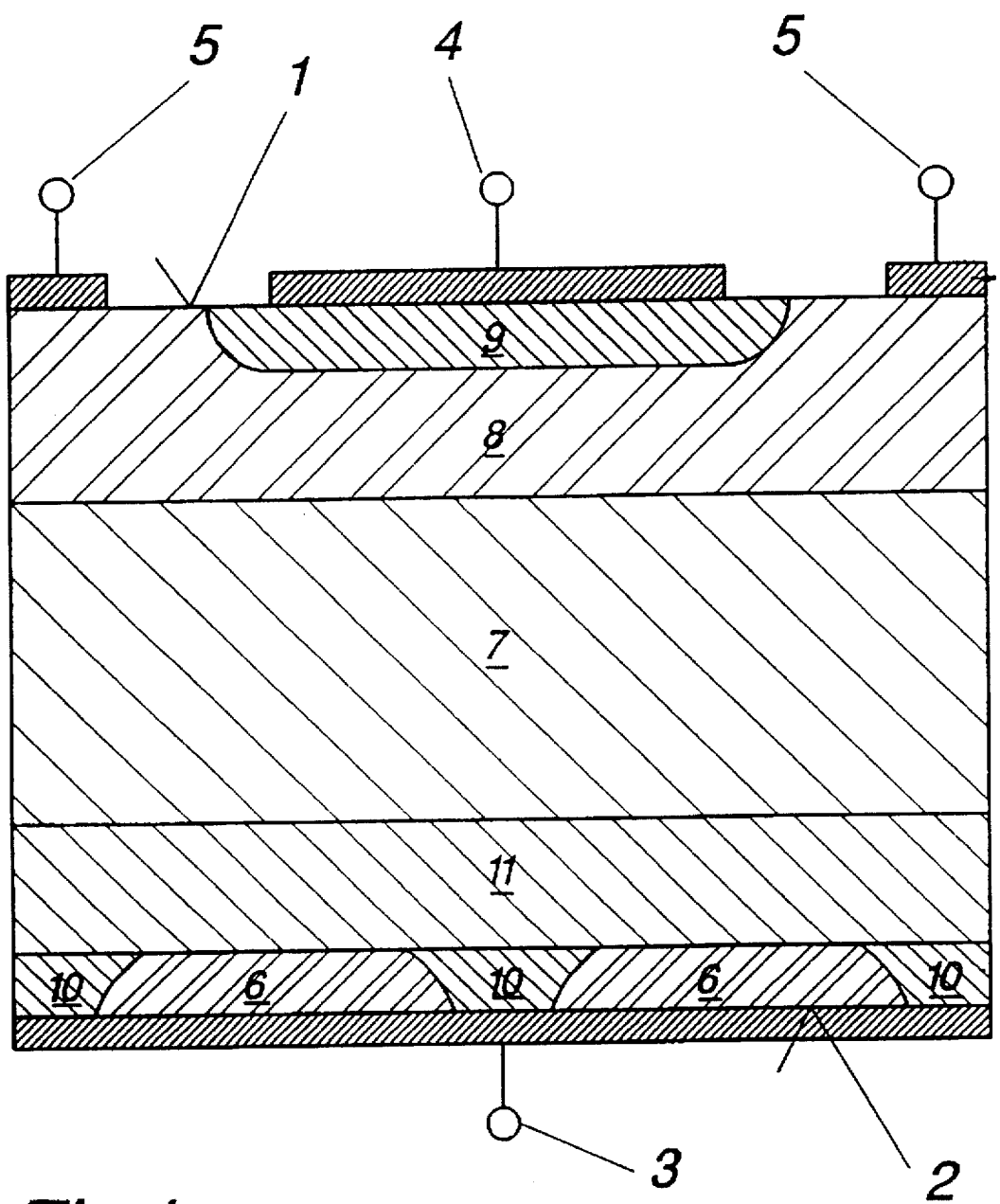
FIG. 1 shows a detail of a thyristor according to the invention in section.

The reference numerals used in the drawings and their meaning are listed in summary in the list of designations.

DESCRIPTION OF THE PREFERRED EMBODIMENTS

Referring now to the drawings, wherein like reference numerals designate identical or corresponding parts throughout the several views, FIG. 1 shows a detail of a GTO according to the invention in section. In general, p-doped regions are shaded with double lines running from upper right to lower left and n-doped regions are shaded with single lines running from upper left to lower right. The density of the shading is dependent on the doping concentration, more highly doped regions being shaded more densely. Metallizations are shaded with lines running densely from upper right to lower left.

A GTO according to the invention comprises, between a first main surface 1 and a second main surface 2, a number of differently doped semiconductor layers 6–9. Viewed from the second main surface 2, these are a p$^+$-doped anode emitter 6, an n-doped n-base 7, a p-doped p-base 8 and an n$^+$-doped cathode emitter anode emitter 6 is connected to an anode metallization which forms an anode electrode 3; the cathode emitter 9 is connected to a corresponding cathode electrode 4. The cathode emitter 9 is incorporated into the p-base 8, so that the p-base 8 partly meets the first main surface 1. The p-base 8 is there connected to a gate electrode 5, formed by a corresponding metallization. By application of a control voltage to the gate electrode 5, the flow of current through the GTO can be turned on and off. This mechanism is sufficiently known and requires no further explanation.

According to the invention, the anode emitter 6 is transparent, which means that it has a comparatively weak injection, so that high proportions of the electron current originating from the cathode can be extracted without recombination, and therefore without filling an injected hole. This is achieved by virtue of the fact that the anode emitter 6 is comparatively lightly doped and thin. In the context of the invention, for example, a depth of approximately 1.2 μm and a doping level of $10^{18}$ cm$^{-3}$ is preferred.

A barrier layer 11 is mounted in front of this transparent anode emitter 6. The barrier layer 11 is more heavily doped than the n-base 7, so that the anode-side field in the barrier layer 11 is limited. The barrier layer 11 preferably has a depth of approximately 20 μm to 40 μm and an edge doping concentration of approximately $7*10^{14}$ cm$^{-3}$.

Anode short-circuits 10 furthermore penetrate through the transparent emitter. These are even more heavily doped than the barrier layer 11. The anode short-circuits 10 serve to produce a pronounced triggering threshold in the component.

The combination of a transparent emitter, anode short-circuits and a barrier layer thus makes it possible to produce the required properties such as higher switching frequency, thinner substrate and no increase in the switching losses.

Figure 2A:
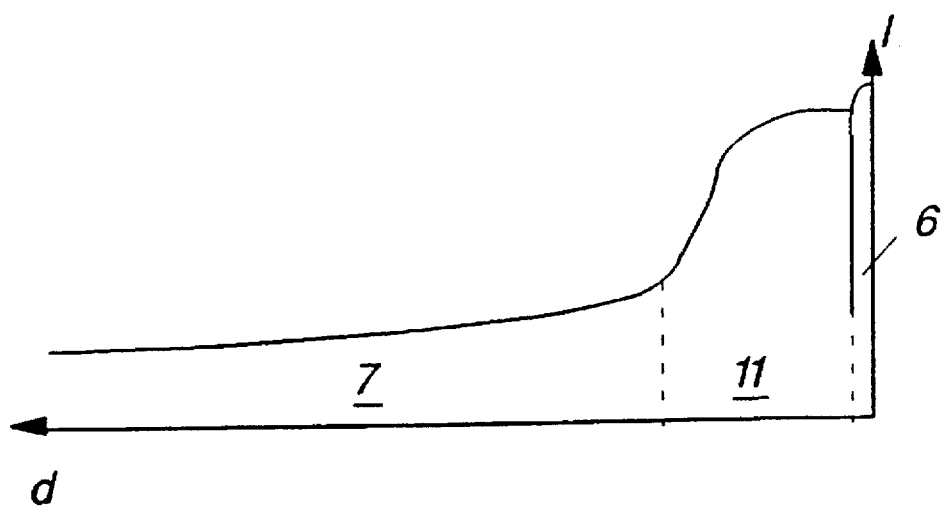
FIGS. 2a–c show three examples of doping profiles of the barrier layer.
Figure 2B:
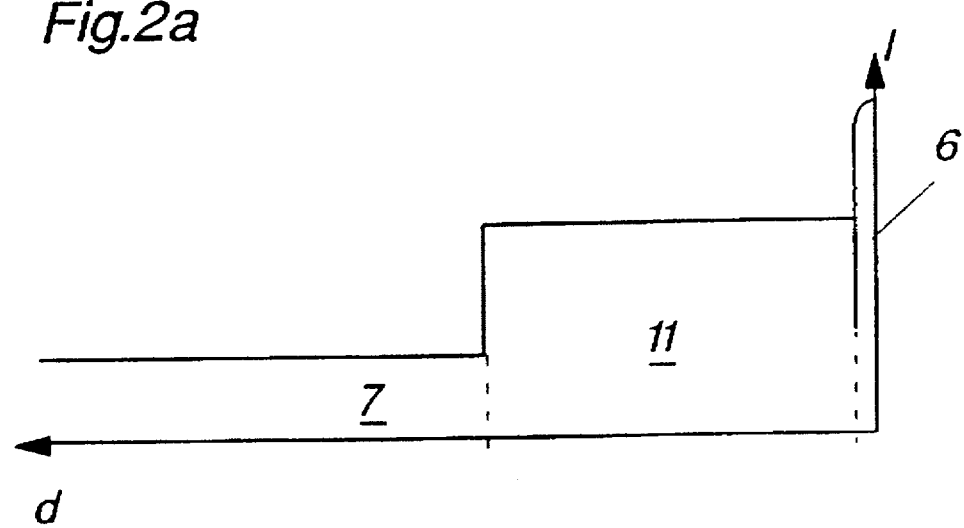
Figure 2C:
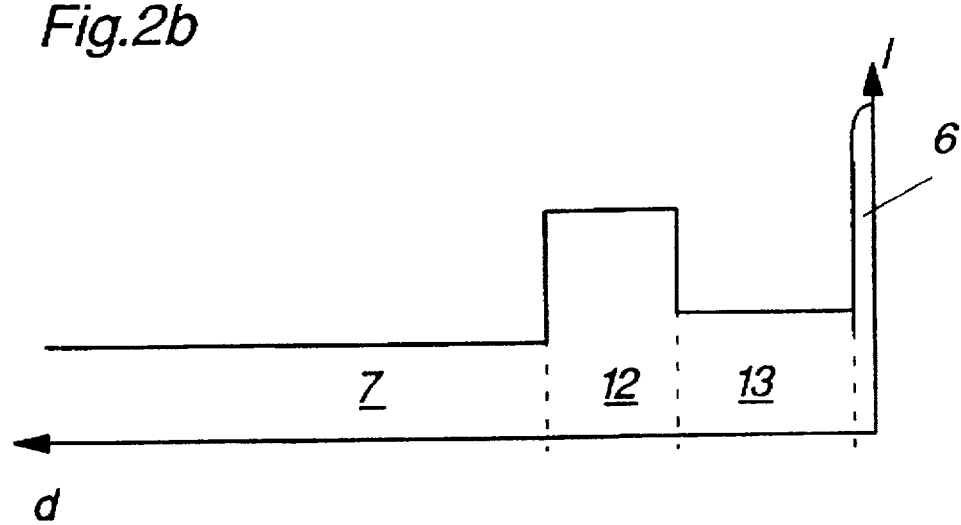

In order for the triggering current not to be excessively high, the anode short-circuits 10 according to the invention have only a relatively small diameter. Values between 5 μm and 10 μm are preferred. The barrier layer 11 can be produced in two ways: either by diffusion or by epitaxy. Epitaxially produced barrier layers offer a further advantage: In the case of diffused barrier layers, the doping profile has an approximately Gaussian distribution (see FIG. 2a). In the case of epitaxially grown barrier layers, the doping is homogeneous over the entire layer thickness. It can therefore be set much more precisely than a diffused profile (see FIGS. 2b and 2c). As a result of this, the depth of the barrier layer can be reduced and the substrate thickness can be decreased. Therefore, because of the homogeneous doping, the charging can be set more effectively in order to limit the anode-side electric field.

It is, however, also possible to produce a barrier layer with multistage doping profile. In particular, if the stage 13 adjoining the anode emitter 6 is more lightly doped than the stage 12 further away from this anode emitter, the anode short-circuits 10 can be provided with relatively large diameters. They are therefore simpler to produce. It is, however, nevertheless guaranteed that the anode short-circuits in the directly adjoining, more lightly doped stage 13, are subjected to a sufficiently low transverse conductance in the barrier layer 11. Field reduction in the barrier layer 11 is undertaken by the more highly doped stage 12.

The more highly doped stage 12 preferably has a doping level of approximately $10^{15}$ cm$^{-3}$ and a depth of approximately 10 μm. A doping level of less than $10^{14}$ cm$^{-3}$ and a depth of approximately 10 μm was selected for the stage 13.

This multistage barrier layer 11 moreover offers a further advantage: The more highly doped stage 12 damps small potential fluctuations which are associated with the existence of the anode short-circuits 10 and cause a significant modulation of the plasma in the region of the short-circuits. A further advantage of this multistage structure consists in that the doping level of $10^{15}$ cm$^{-3}$ of the stage 12, together with the depth of approximately 10 μm, guarantees that even very high electric fields can be reduced. In the case of a GTO according to the prior art, this would be possible only through increasing the charge in the barrier layer and the concomitant disadvantages for the triggering properties or the conductivity. Without matching of the barrier layer, as described, there would be a threat of "punch through" when applying the maximum blocking voltage, or even sooner.

It can be stated overall that the combination according to the invention of a barrier layer, anode short-circuits and a transparent emitter makes it possible to produce a GTO which can be operated at higher switching frequencies, has a thinner substrate and the conducting-state losses of which are nevertheless not increased. As explained, further advantages can also be obtained by varying the depth of the barrier layer and its doping level.

Obviously, numerous modifications and variations of the present invention are possible in light of the above teachings. It is therefore to be understand that within the scope of the appended claims, the invention may be practiced otherwise than as specifically described herein.

LIST OF DESIGNATIONS

1 First main surface
2 Second main surface
3 Anode electrode
4 Cathode electrode
5 Gate electrode
6 Anode emitter
7 n-Base
8 p-Base
9 Cathode emitter
10 Anode short-circuits
11 Barrier layer
12 First stage
13 Second stage
I Doping density
d Distance from the second main surface

What is claimed as new and desired to be secured by Letters Patent of the United States is:

1. A gate turn-off thyristor, comprising:
   a) between a first main surface and a second main surface, a number of differently doped semiconductor layers;
   b) on the second main surface, an anode electrode and, on the first main surface, a cathode electrode and a gate electrode;
   c) the semiconductor layers comprising, viewed from the second main surface, a $p^+$-doped anode emitter, an n-doped n-base and a p-doped p-base, the anode emitter being in electrical contact with the anode electrode and the p-base being in electrical contact with the gate electrode, and $n^+$-doped cathode-emitter regions, which are in electrical contact with the cathode electrode, being incorporated in the p-base;
   wherein
   d) the anode emitter is designed as a transparent emitter;
   e) $n^+$-doped anode short-circuit regions penetrate through the anode emitter, and
   f) an n-doped barrier layer is provided between the n-base and the anode emitter, said barrier layer being epitaxially produced and having at least a two-stage doping profile, including a first stage, further away from the second main surface, being more heavily doped, and a second stage, directly adjoining the second main surface, being more lightly doped relative to the first stage.

2. The thyristor as claimed in claim 1, wherein the barrier layer is diffused and, in particular, has a depth of approximately 20 μm to 40 μm and an edge concentration of approximately $7*10^{14}$ $cm^{-3}$.

3. The thyristor as claimed in claim 2, wherein the transparent emitter has a depth of approximately 1.2 μm and a doping level of approximately $10^{18}$ $cm^{-3}$.

4. The thyristor as claimed in claim 2, wherein the anode short-circuit regions have a small diameter of, in particular, 5 μm to 10 μm.

5. The thyristor as claimed in claim 1, wherein the barrier layer is epitaxially produced and, in particular, has a depth of approximately 20 μm to 40 μm.

6. The thyristor as claimed in claim 5, wherein the said first stage of said barrier layer has a doping level of approximately $10^{15}$ $cm^{-3}$ and a depth of approximately 10 μm, and said second stage of said barrier layer has a doping level of less than approximately $10^{14}$ $cm^{-3}$ and a depth of approximately 10 μm.

7. The thyristor as claimed in claim 6, wherein the transparent emitter has a depth of approximately 1.2 μm and a doping level of approximately $10^{18}$ $cm^{-3}$.

8. The thyristor as claimed in claim 6, wherein the anode short-circuit regions have a small diameter of, in particular, 5 μm to 10 μm.

9. The thyristor as claimed in claim 5, wherein the transparent emitter has a depth of approximately 1.2 μm and a doping level of approximately $10^{18}$ $cm^{-3}$.

10. The thyristor as claimed in claim 5, wherein the anode short-circuit regions have a small diameter of, in particular, 5 μm to 10 μm.

11. The thyristor as claimed in claim 1, wherein the transparent emitter has a depth of approximately 1.2 μm and a doping level of approximately $10^{18}$ $cm^{-3}$.

12. The thyristor as claimed in claim 11, wherein the anode short-circuit regions have a small diameter of, in particular, 5 μm to 10 μm.

13. The thyristor as claimed in claim 1, wherein the anode short-circuit regions have a small diameter of, in particular, 5 μm to 10 μm.

* * * * *